United States Patent
Yoon et al.

(10) Patent No.: US 11,594,664 B2
(45) Date of Patent: Feb. 28, 2023

(54) LIGHT EMITTING DIODE PACKAGE

(71) Applicant: SAMSUNG ELECTRONICS CO., LTD., Suwon-si (KR)

(72) Inventors: Seungjin Yoon, Hwaseong-si (KR); Hosik Jun, Hwaseong-si (KR); Sangbok Yun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 220 days.

(21) Appl. No.: 16/877,941

(22) Filed: May 19, 2020

(65) Prior Publication Data

US 2021/0159377 A1    May 27, 2021

(30) Foreign Application Priority Data

Nov. 22, 2019   (KR) .................. 10-2019-0151399

(51) Int. Cl.
| | | |
|---|---|---|
| *H01L 33/62* | (2010.01) | |
| *H01L 33/50* | (2010.01) | |
| *H01L 33/48* | (2010.01) | |
| *H01L 25/075* | (2006.01) | |
| *H01L 33/56* | (2010.01) | |

(52) U.S. Cl.
CPC .......... *H01L 33/62* (2013.01); *H01L 25/0753* (2013.01); *H01L 33/486* (2013.01); *H01L 33/505* (2013.01); *H01L 33/56* (2013.01)

(58) Field of Classification Search
CPC ... H01L 25/0753; H01L 25/167; H01L 33/62; H01L 33/52; H01L 33/54; H01L 33/60; H01L 33/486; H01L 33/505; H01L 33/56
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |

(Continued)

FOREIGN PATENT DOCUMENTS

| | | |
|---|---|---|
| KR | 10-0849813 B1 | 7/2008 |
| KR | 10-1101134 B1 | 1/2012 |

(Continued)

*Primary Examiner* — Raj R Gupta

(74) *Attorney, Agent, or Firm* — Sughrue Mion, PLLC

(57) ABSTRACT

A light emitting diode (LED) package is provided. The LED package includes a package body having a concave portion; an LED chip disposed on the concave portion; a phosphor sheet disposed on the LED chip; a barrier wall disposed on the concave portion and spaced apart from the LED chip by a first distance, the barrier wall being disposed in parallel with at least one side surface of the LED chip, an upper surface of the barrier wall being higher than an upper surface of the LED chip with respect to the lower surface of the concave portion and disposed at a level that is 50 μm or less from an upper surface of the phosphor sheet; and an encapsulation portion disposed on the LED chip, a side surface of the phosphor sheet and a side surface of the barrier wall.

18 Claims, 5 Drawing Sheets

A

(56) References Cited

U.S. PATENT DOCUMENTS

| | | |
|---|---|---|
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 10,522,518 B2 * | 12/2019 | Ng ............... H01L 25/0753 |
| 2011/0215349 A1 * | 9/2011 | An ............... H01L 33/486 |
| | | 257/89 |
| 2015/0260357 A1 * | 9/2015 | Liaw ............... F21K 9/62 |
| | | 362/231 |
| 2015/0340574 A1 * | 11/2015 | Tamaki ............... H01L 33/507 |
| | | 438/27 |
| 2016/0079217 A1 * | 3/2016 | Egoshi ............... H01L 25/167 |
| | | 257/98 |
| 2019/0165040 A1 | 5/2019 | Dupont et al. |
| 2020/0212255 A1 * | 7/2020 | Yamaoka ............... H01L 33/58 |

FOREIGN PATENT DOCUMENTS

| | | |
|---|---|---|
| KR | 10-2019-0023094 A | 3/2019 |
| KR | 10-2019-0042167 A | 4/2019 |
| KR | 10-1973428 B1 | 4/2019 |

* cited by examiner

LIGHT EMITTING DIODE PACKAGE

CROSS-REFERENCE TO RELATED APPLICATION

This application claims priority from Korean Patent Application No. 10-2019-0151399 filed on Nov. 22, 2019 with the Korean Intellectual Property Office, the disclosure of which is incorporated herein by reference in its entirety.

BACKGROUND

Field

Methods and apparatuses consistent with example embodiments relate to a light emitting diode (LED) package.

Related Art

A light emitting element, such as a light emitting diode (LED), converts energy generated by electron-hole recombination at semiconductor junctions into light and emits the same. Such LEDs are commonly employed as light sources in general lighting devices, display devices, and the like, and the development of LEDs has thus been accelerated.

In particular, lighting devices employing gallium nitride (GaN)-based LEDs has actively been developed. In addition, products in which LEDs are used, such as the backlight units of large TVs, vehicle headlamps, general lighting devices, and the like, are gradually moving toward large-sized products having high outputs and high efficiency, and the range of LED use is being further expanded.

Technology to selectively turn several LED packages on and off has been made for the vehicle headlamps by adopting a plurality of LED packages to prevent glare to an oncoming vehicle or pedestrian. Accordingly, there is an increasing need to increase contrast so that light emitted from a turned-on LED package does not affect an irradiation region of a turned-off LED package.

SUMMARY

Example embodiments provide an LED package having improved contrast.

According to an aspect of an example embodiment, an LED package includes a package body having a lead frame and a concave portion, the lead frame being exposed through a lower surface of the concave portion; an LED chip disposed on the lower surface of the concave portion and electrically connected to the lead frame; a phosphor sheet disposed on the LED chip; a barrier wall disposed on the lower surface of the concave portion and spaced apart from the LED chip by a first distance, the barrier wall being disposed in parallel with at least one side surface of the LED chip, the barrier wall the package body being formed of a common material, an upper surface of the barrier wall being higher than an upper surface of the LED chip with respect to the lower surface of the concave portion and disposed at a level that is 50 µm or less from an upper surface of the phosphor sheet; and an encapsulation portion disposed on the LED chip, a side surface of the phosphor sheet and a side surface of the barrier wall, the encapsulation portion being formed of a material different from the common material.

According to an aspect of an example embodiment, an LED package includes at least one LED chip; a phosphor sheet disposed on the at least one LED chip; a package body comprising a first region on which the at least one LED chip is disposed and a second region outside the first region; a barrier wall disposed in the second region and spaced apart from the at least one LED chip by a first distance, the barrier wall and the package body being formed of a common material; and an encapsulation portion encapsulating the at least one LED chip, a side surface of the phosphor sheet and a side surface of the barrier wall, wherein the encapsulation portion is formed of a material different from the common material.

According to an aspect of an example embodiment, an LED package includes at least one LED chip; a phosphor sheet disposed on the at least one LED chip; a package body comprising a first surface on which the at least one LED chip is disposed, a barrier wall spaced apart from the at least one LED chip by a first distance, an upper surface of the barrier wall being higher than an upper surface of the at least one LED chip with respect to the first surface of the package body and disposed at a level 50 µm or less from an upper surface of the phosphor sheet; and an encapsulation portion disposed on the at least one LED chip, a side surface of the phosphor sheet and a side surface of the barrier wall.

BRIEF DESCRIPTION OF THE DRAWINGS

The above and other aspects, features and advantages will be more clearly understood from the following description of example embodiments, taken in conjunction with the accompanying drawings, in which.

DETAILED DESCRIPTION

Hereinbelow, example embodiments will be described in detail with reference to the accompanying drawings.

Figure 1:
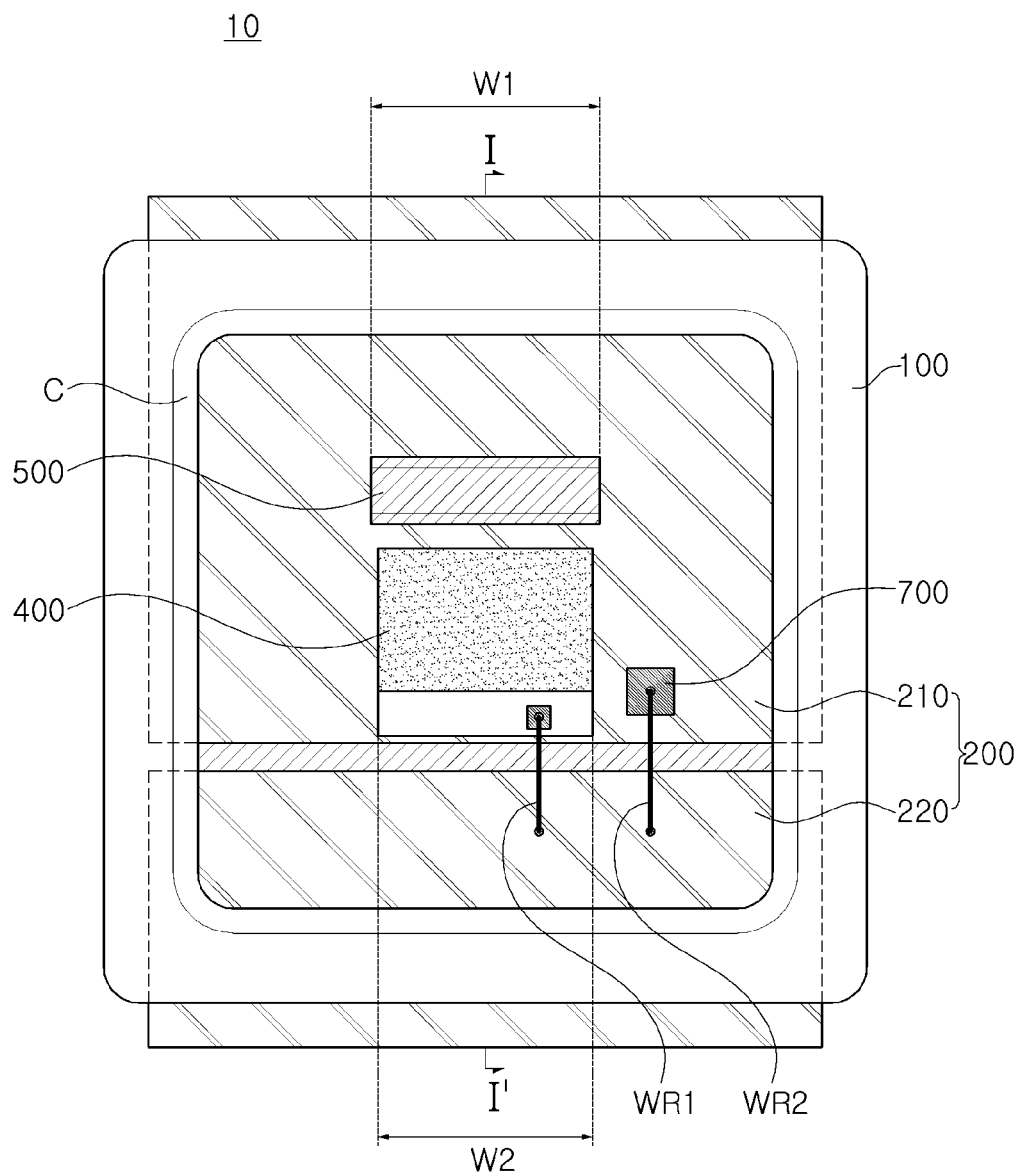
FIG. 1 is a planar view of an LED package according to an example embodiment.

A light emitting diode (LED) package according to an example embodiment will be described based on FIGS. 1 to 3. FIG. 1 is a planar view illustrating an LED package according to an example embodiment, and FIG. 2 is a side cross-sectional view of FIG. 1, taken along line I-I', and FIG. 3 is an enlarged view of region "A" of FIG. 2.

Figure 2:
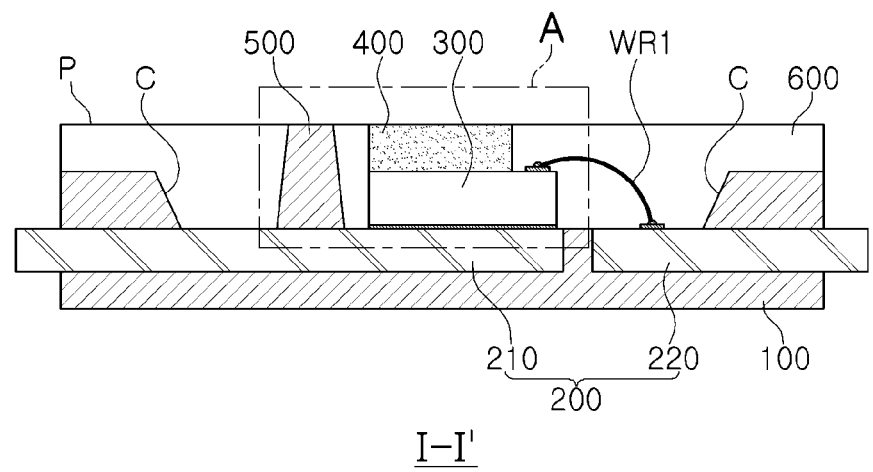
FIG. 2 is a side cross-sectional view of FIG. 1, taken along line I-I'.
Figure 3:
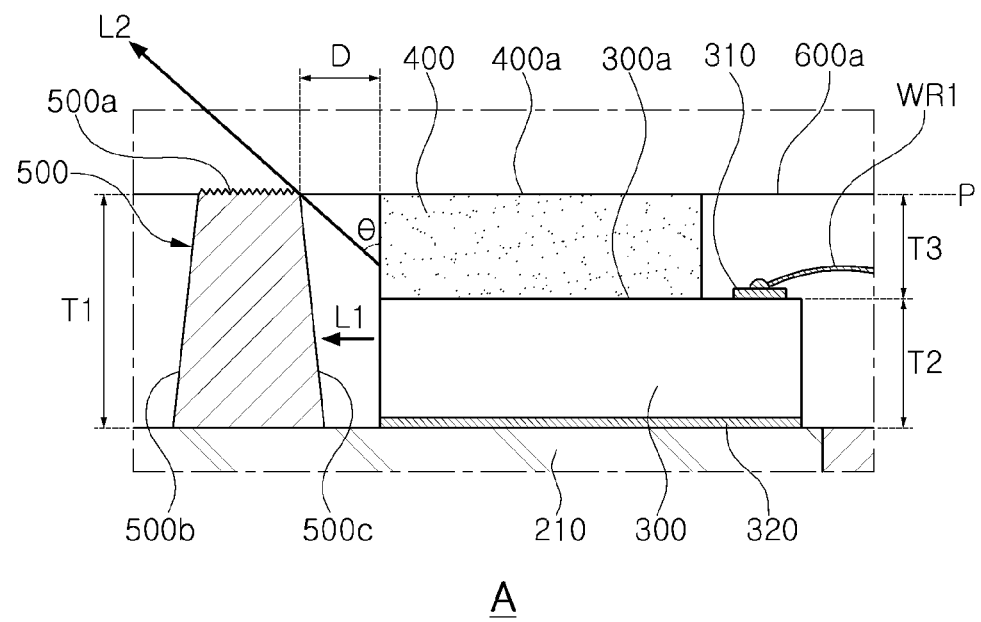
FIG. 3 is an enlarged view of region "A" of FIG. 2.

With reference to FIGS. 1 and 2, an LED package 10 may include a package body 100, an LED chip 300, a phosphor sheet 400, a barrier wall 500 and an encapsulation portion 600.

The package body 100 includes a region on which the LED chip 300 is mounted and may include an electrode structure for applying power to the LED chip 300. According to example embodiments, a concave portion C may be disposed in a central region of the package body 100. The region on which the LED chip 300 is mounted may be disposed on a lower surface of the concave portion C. Accordingly, the package body 100 may serve as a base substrate on which the LED chip 300 is mounted during manufacturing of the LED package 10.

A lead frame 200 may be disposed in the package body 100 as the electrode structure for providing power to the LED chip 300. The lead frame 200 may include first lead frame 210 and second lead frame 220. Portions of the first lead frame 210 and the second lead frame 220 may be exposed to a lower surface of the concave portion C. In an example embodiment, the LED chip 300 may be mounted on the first lead frame 210 and may be wire-bonded to the second lead frame 220 through a first wire WR1.

The package body 100 may be formed of an insulating resin material containing an epoxy, triazine, silicone, polyimide, and the like, but may also be formed of a ceramic material, such as $Al_2O_3$, AlN, or the like, having high heat resistance, excellent thermal conductivity, high reflection efficiency for enhanced heat dissipation characteristics and increased luminous efficiency.

In an example embodiment, the package body 100 may be formed of an epoxy molding compound (EMC). The package body 100 may be formed by molding an insulating resin material in one region of the first lead frame 210 and the second lead frame 220.

The LED chip 300 may be mounted on the package body 100. The LED chip 300 may be disposed in plural, and a plurality of the LED chips 300 may be linearly disposed in one direction.

The LED chip 300 may include a light emitting structure including a first conductivity-type semiconductor layer, an active layer and a second conductivity-type semiconductor layer. The active layer may emit blue light (e.g., 440 nm to 460 nm) or ultraviolet light (e.g., 380 nm to 440 nm). First electrode 310 and second electrode 320 for applying power to the light emitting structure may be disposed on the LED chip 300. In an example embodiment, the first electrode 310 and the second electrode 320 are disposed on upper and lower surfaces of the LED chip 300. However, example embodiments are not limited thereto. According to example embodiments, the first electrode 310 and the second electrode 320 may all be disposed on one surface of the LED chip 300.

The phosphor sheet 400 may be formed in the form of a sheet having a substantially constant thickness. The phosphor sheet 400 may be formed by mixing a wavelength converting material with a semi-cured resin material, and may be, for example, a composite material in which a wavelength converting material is mixed with a polymer binder formed of a resin, a curing agent, a curing catalyst, and the like, and semi-cured. As the resin used for the phosphor sheet 400, an epoxy resin or a silicone resin may be used.

In an example embodiment, the phosphor sheet 400 may be formed by mixing a phosphor with B-stage silicone and semi-curing the same. The phosphor sheet 400 may have a structure in which a single layer is stacked or may be formed to have multiple layers. In the case in which the phosphor sheet 400 is formed to have multiple layers, different types of phosphors are included in each layer.

Garnet-based phosphors (e.g., YAG, TAG, LuAG), silicate-based phosphors, nitride-based phosphors, sulfide-based phosphors, oxide-based phosphors, and the like, may be used as the phosphors. A single phosphor may be used, or multiple phosphors may be mixed in a predetermined ratio.

The barrier wall 500 may be disposed on a lower surface of the concave portion C. The barrier wall 500 may be disposed on at least one side of the LED chip 300 to be parallel to the LED chip 300 by a pre-determined distance D. According to an example embodiment, a plurality of the barrier walls 500 may be disposed on each side surface of the LED chip 300. Alternatively, one barrier wall 500 may be disposed to surround each side surface of the LED chip 300. In the case in which a plurality of the LED chips 300 are disposed, the barrier wall may be disposed along the one direction in which a plurality of the LED chips 300 are linearly disposed or disposed to surround a plurality of the LED chips 300 as a whole.

The barrier wall 500 may be formed of an insulating resin material containing an epoxy, triazine, silicone, polyimide, and the like. According to an example embodiment, the barrier wall 500 may be formed of the same material as the package body 100. The barrier wall 500 may be black. In an example embodiment, the barrier wall 500 may be formed of an EMC. Accordingly, the barrier wall 500 may be manufactured together with the package body 100 during manufacturing of the package body 100. However, example embodiments are not limited thereto. For example, the barrier wall 500 may be manufactured separately from the package body 100 and then attached within the concave portion C of the package body 100 during the manufacturing of the package body 100. The barrier wall 500 may include an upper surface 500a and side surfaces 500b and 500c. The upper surface 500a may be planar. The side surfaces 500b and 500c may be perpendicular to the lower surface of the concave portion C, but example embodiments are not limited thereto. For example, side surfaces 500b and 500c may be inclined at a pre-determined angle. A concavo-convex portion may further be formed on the upper surface 500a and/or the side surfaces 500b and 500c of the barrier wall 500 for enhancing a light reflection effect.

As illustrated in FIG. 3, the upper surface 500a of the barrier wall 500 may be disposed at a higher level than an upper surface 300a of the LED chip 300 but may be disposed to have a height T1 within a level range not exceeding 50 µm from an upper surface 400a of the phosphor sheet 400. That is, the height T1 of the barrier wall 500 is greater than that T2 of the LED chip 300, and may be taller by 50 µm or less (T2+T3+50 µm or less) than a sum of the size T2 of the LED chip 300 and a thickness T3 of the phosphor sheet (T2+T3). When the barrier wall 500 is lower than the upper surface 300a of the LED chip 300, light L1 emitted in a lateral direction of the LED chip 300 is emitted toward a side surface of the LED package over the barrier wall 500. In this regard, contrast of the LED package by employing the barrier wall 500 may be reduced. In addition, when the barrier wall 500 is disposed on a level of 50 µm or more from the upper surface 400a of the phosphor sheet 400, the barrier wall 500 is excessively extruded from an upper portion of the LED package 10, thereby reducing reliability of the LED package 10. In an example embodiment, the upper surface 400a of the phosphor sheet 400, an upper surface 600a of the encapsulation portion 600 and the upper surface 500a of the barrier wall 500 may be coplanar P.

The barrier wall 500 may be disposed such that a length W1 thereof may be identical to a length W2 of one side surface of the LED chip 300. According to an example embodiment, the length W1 of the barrier wall 500 may be larger than that W2 of the one side surface of the LED chip 300. Further, the barrier wall 500 may be disposed to be in a pre-determined distance D from the LED chip 300. In an example embodiment, the pre-determined distance D may be about 50 µm to about 200 µm.

According to an example embodiment, a protective element 700, such as a Zener diode, may be formed on the first lead frame 210. The protective element 700 may be bonded to the second lead frame 220 by a second wire WR2 to be electrically connected in parallel with the LED chip 300. Accordingly, even when a reverse current is applied to the LED chip 300 due to static electricity, the current may be bypassed through the protective element 700, thereby preventing the LED chip 300 from being damaged by the static electricity.

The encapsulation portion 600 may be disposed to surround the LED chip 300 and a side surface of the phosphor sheet 400. The encapsulation portion 600 may encapsulate the LED chip 300 and the phosphor sheet 400 to protect the same from moisture and heat and adjust light distribution of light emitted from the LED chip 300 by adjusting a surface shape.

The encapsulation portion 600 may be formed of a light transmissive material, specifically, a light transmissive resin such as a composition containing silicone, modified silicone, an epoxy, urethane, oxetane, acryl, polycarbonate and polyimide. In an example embodiment, the encapsulation portion 600 may be formed of a white silicone resin. In addition, when the package body is formed of a ceramic and the barrier wall 500 is formed of an EMC, the encapsulation portion 600 may be formed of a liquid crystal polymer.

The LED package 10 according to an example embodiment has an effect of contrast-generation of emitted light, and this will be described with reference to FIG. 3.

As shown in FIG. 3, among the light emitted from the LED chip 300, light incident directly to the encapsulation portion 600 without passing through the phosphor sheet 400, that is, light L1 emitted in the lateral direction of the LED chip 300 is blocked and reflected by the barrier wall 500 and is directed in an LED chip 300 direction or a phosphor sheet 400 direction. In addition, light L2 emitted from the LED chip 300 and passing through the phosphor sheet 400 may irradiate over the barrier wall 500 only in the case of a pre-determined irradiation angle θ by the barrier wall 500. Accordingly, the irradiation angle of the light emitted from the LED chip 300 can be limited by the barrier wall 500 without an additional lens structure. Accordingly, contrast may be improved as a region irradiated with light and not irradiated with light are clearly distinguished in front of the LED package 10.

According to an example embodiment, a vehicle headlamp may include a plurality of the LED packages 10, and technology to selectively power the LED packages may be applied to prevent glare to an oncoming vehicle or pedestrian while driving. Such technology may be maximized when a region to which the light emitted from each LED package 10 is emitted does not overlap with light emitted from a neighboring LED package 10. When the LED package 10 has low contrast, light emitted from a selectively turned-on LED package may be irradiated to a region corresponding to a turned-off LED package, and the region in which the LED package 10 is turned off emits light. In the case of a LED package 10 according to an example embodiment, the light emitted from the turned-on LED package can be prevented from being irradiated onto a region corresponding to the turned-off LED package, thereby increasing contrast. Accordingly, the turned-off area is completely turned off, thereby improving the effect of preventing glare to the oncoming vehicle or pedestrian.

For example, a barrier wall may be disposed on one side of an LED chip but not another side of the LED chip. As shown in Table 1 below, contrast corresponding to the side of the LED chip with the barrier wall can be compared with the side of the LED that does not have a corresponding barrier wall. As shown in Table 1, the contrast of the region disposed with the barrier wall was measured to be improved compared to the region without the corresponding barrier wall. Experimental Examples 1 and 2 were measured to have the contrast of the region disposed with the barrier increased by 28.9% and 43.3%, respectively.

TABLE 1

|  | Experimental Example 1 | Experimental Example 2 |
|---|---|---|
| Contrast of region without corresponding barrier wall | 1:816 | 1:738 |
| Contrast of region with corresponding barrier wall | 1:1149 | 1:1303 |

Figure 4:
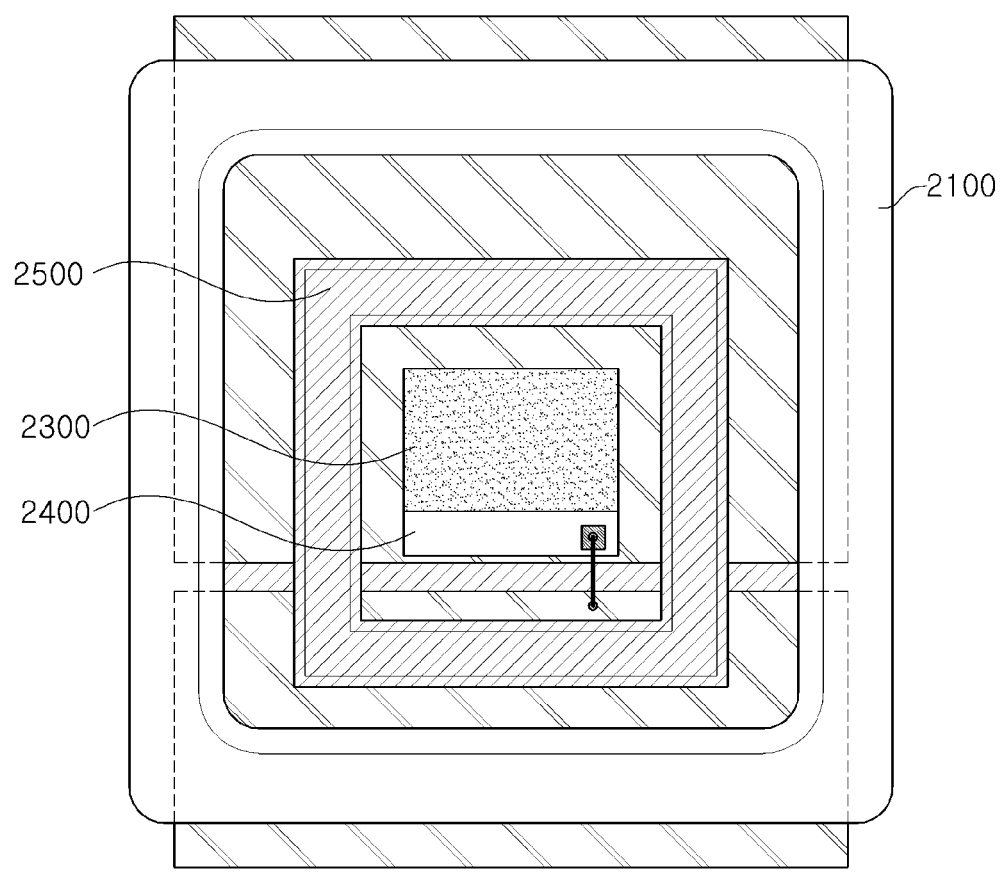
FIGS. 4 to 6 are planar views of LED packages according to example embodiments.
Figure 5:
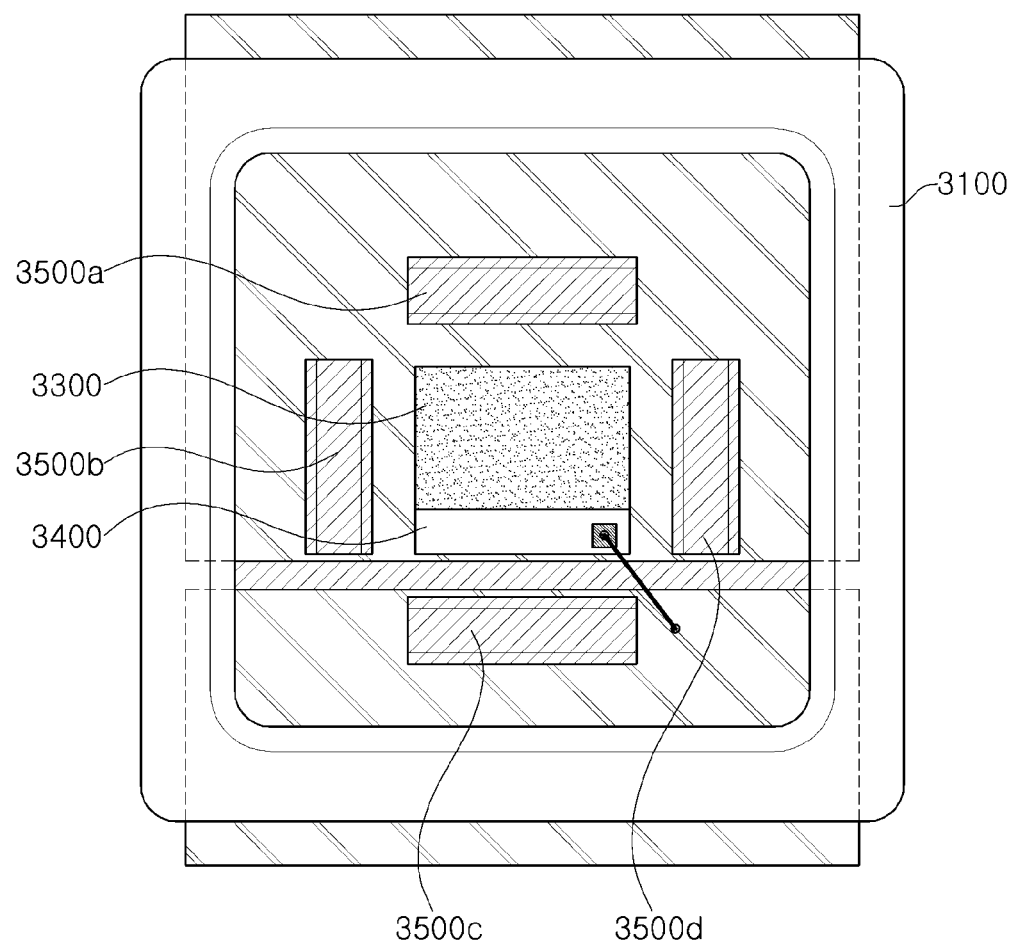
Figure 6:
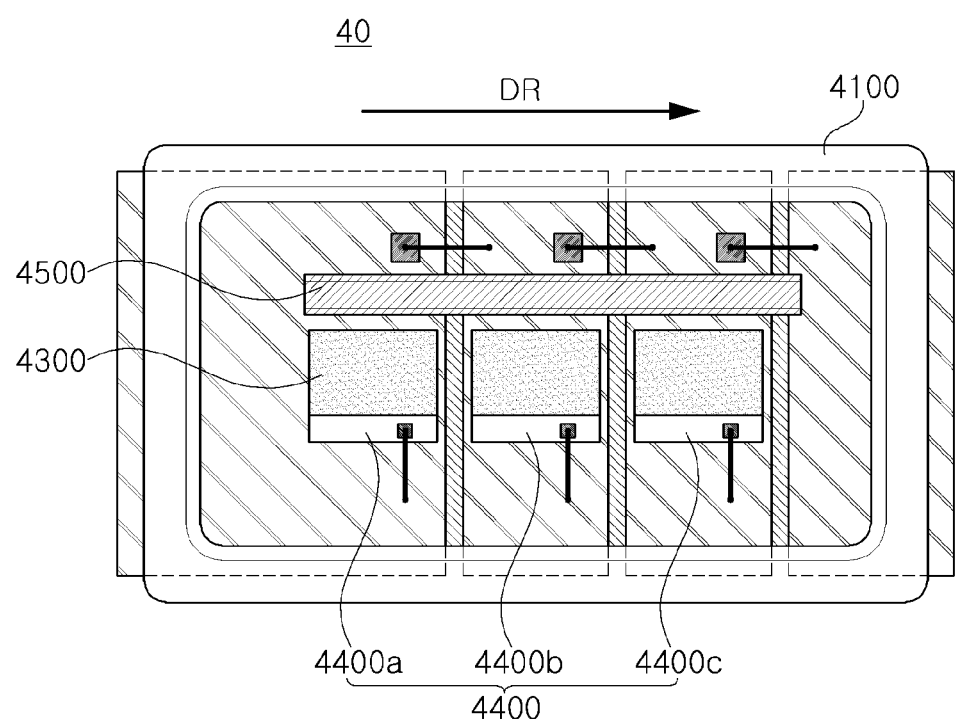

LED packages according to example embodiments will now be described with reference to FIGS. 4 to 6. FIGS. 4 to 6 are diagrams illustrating various example embodiments of an LED package. In order to prevent duplication of descriptions with the above-described example embodiment, a description will be made based on differences.

FIG. 4 illustrates an LED package 20 according to an example embodiment. The LED package 20 is similar to the LED package 10 described above in that an LED chip 2400 is mounted on a package substrate 2100 and a phosphor sheet 2300 is disposed on the LED chip 2400. However, as shown in FIG. 4, the LED package 20 has a single barrier wall 2500 disposed to surround each side surface of the LED chip 2400. As compared to the LED package 10, contrast may be further improved due to the barrier wall 2500 that corresponds to additional surfaces of the LED chip 2400.

FIG. 5 illustrates an LED package 30 according to an example embodiment. The LED package 30 is similar to the LED package 10 described above in that an LED chip 3400 is mounted on a package substrate 3100 and a phosphor sheet 3300 is disposed on the LED chip 3400. However, as shown in FIG. 5, the LED package 30 includes a plurality of barrier walls 3500a to 3400d are disposed to surround each side surface of the LED chip 3400. As compared to the LED package 10, contrast may be further improved as a plurality of the barrier walls 3500 are spaced apart from each other, resulting in spaces therebetween, to which an insulating material for forming an encapsulation portion may be introduced. This also allows for reduced complexity of manufacturing of the encapsulation portion.

FIG. 6 illustrates an LED package 40 according to an example embodiment. The LED package 40 includes an LED chip 440 which includes a plurality of LED chips 4400a to 4400c, which are similar to the LED package 10 described above in that a plurality of the LED chips 4400a to 4400c are mounted on a package substrate 4100 and a phosphor sheet 4300 is disposed on a plurality of the LED chips 4400a to 4400c. The plurality of the LED chips 4400a to 4400c may be linearly disposed in one direction DR, and the barrier wall 4500 may also be linearly disposed on one side of the plurality of the LED chips 4400a to 4400c in the one direction DR.

As set forth above, an LED package according to an example embodiment may have improved contrast due to a barrier wall disposed around an LED chip.

While example embodiments have been shown and described above, it will be apparent to those skilled in the art that modifications and variations may be made without departing from the scope in the present disclosure as defined by the appended claims.

What is claimed is:

1. A light emitting diode (LED) package, comprising:
   a package body having a lead frame and a concave portion, the lead frame being exposed through a lower surface of the concave portion;
   an LED chip disposed on the lower surface of the concave portion and electrically connected to the lead frame;
   a phosphor sheet disposed on the LED chip;

a barrier wall disposed on the lower surface of the concave portion between the LED chip and a sidewall of the concave portion that faces the barrier wall, the barrier wall being spaced apart from the sidewall of the concave portion, the barrier wall being spaced apart from the LED chip by a first distance, the barrier wall being disposed in parallel with at least one side surface of the LED chip, the barrier wall and the package body being formed of a common material, an upper surface of the barrier wall being higher than an upper surface of the LED chip with respect to the lower surface of the concave portion and disposed at a level that is 50 μm or less from an upper surface of the phosphor sheet; and an encapsulation portion disposed on the LED chip, a side surface of the phosphor sheet and a side surface of the barrier wall, the encapsulation portion being formed of a material different from the common material, wherein the upper surface of the phosphor sheet, an upper surface of the encapsulation portion and the upper surface of the barrier wall are coplanar.

2. The LED package of claim 1, wherein the package body and the barrier wall are formed of an epoxy molding compound, and wherein the encapsulation portion is formed of a white silicone resin.

3. The LED package of claim 1, wherein a concavo-convex portion is formed on at least one of a side wall and the upper surface of the barrier wall.

4. The LED package of claim 1, wherein the barrier wall comprises a plurality of separated regions, and wherein each of the plurality of separated regions is disposed on the lower surface of the concave portion at positions corresponding to different side surfaces of the LED chip.

5. The LED package of claim 1, wherein the LED chip comprises a plurality of LED chips, wherein the plurality of LED chips are linearly arranged in a first direction, and wherein the barrier wall extends in the first direction on one side of the plurality of LED chips.

6. The LED package of claim 5, wherein the barrier wall extends around the plurality of LED chips to surround the plurality of LED chips.

7. The LED package of claim 1, wherein the lead frame comprises a first lead frame and a second lead frame, and wherein the LED chip is disposed on the first lead frame and is electrically connected to the second lead frame through a wire bonding.

8. The LED package of claim 1, wherein the first distance is between 50 μm and 200 μm.

9. The LED package of claim 1, wherein the upper surface of the barrier wall is at a level equal to or higher than an upper surface of the package body with respect to the lower surface of the concave portion.

10. The LED package of claim 1, wherein a length of the barrier wall is greater than a length of one side of the LED chip.

11. A light emitting diode (LED) package, comprising:
at least one LED chip;
a phosphor sheet disposed on the at least one LED chip;
a package body comprising a first region on which the at least one LED chip is disposed and a second region outside the first region;

a barrier wall disposed in the second region between the at least one LED chip and a sidewall of the package body that faces the barrier wall, the barrier wall being spaced apart from the sidewall of the package body, the barrier wall being spaced apart from the at least one LED chip by a first distance, and the barrier wall and the package body being formed of a common material; and an encapsulation portion encapsulating the at least one LED chip, a side surface of the phosphor sheet and a side surface of the barrier wall, wherein the encapsulation portion is formed of a material different from the common material, wherein an upper surface of the phosphor sheet, an upper surface of the encapsulation portion and an upper surface of the barrier wall are coplanar.

12. The LED package of claim 11, wherein the upper surface of the barrier wall is higher than an upper surface of the at least one LED chip with respect to the first region of the package body.

13. The LED package of claim 11, wherein the package body and the barrier wall are formed of a black epoxy molding compound, and wherein the encapsulation portion is formed of a white silicone resin.

14. The LED package of claim 11, wherein a distance between a side surface of the phosphor sheet and the barrier wall is between 50 μm and 200 μm.

15. A light emitting diode (LED) package, comprising:
at least one LED chip;
a phosphor sheet disposed on the at least one LED chip;
a package body comprising a first surface on which the at least one LED chip is disposed and a sidewall that faces the at least one LED chip,
a barrier wall between the at least one LED chip and the sidewall, the barrier wall being spaced apart from the sidewall, the barrier wall being spaced apart from the at least one LED chip by a first distance, and an upper surface of the barrier wall being higher than an upper surface of the at least one LED chip with respect to the first surface of the package body; and
an encapsulation portion disposed on the at least one LED chip, a side surface of the phosphor sheet and a side surface of the barrier wall,
wherein an upper surface of the phosphor sheet, an upper surface of the encapsulation portion and the upper surface of the barrier wall are coplanar.

16. The LED package of claim 15, wherein the package body and the barrier wall are formed of an epoxy molding compound, and wherein the encapsulation portion is formed of a silicone resin.

17. The LED package of claim 16, wherein the barrier wall is black and the encapsulation portion is white.

18. The LED package of claim 15, wherein the package body is formed of a ceramic, wherein the barrier wall is formed of an epoxy molding compound, and wherein the encapsulation portion is formed of a liquid crystal polymer.

* * * * *